United States Patent
Park et al.

(10) Patent No.: US 9,431,988 B2
(45) Date of Patent: Aug. 30, 2016

(54) STACKED CHIP DEVICE

(71) Applicant: INNOCHIPS TECHNOLOGY CO. LTD., Ansan-Si, Gyeonggi-Do (KR)

(72) Inventors: In Kil Park, Seognam-Si (KR); Tae Hyung Noh, Siheung-Si (KR); Gyeong Tae Kim, Ansan-Si (KR); Tae Geun Seo, Osan-Si (KR); Myung Ho Lee, Ansan-Si (KR); Min Soo Lee, Daejeon (KR)

(73) Assignee: INNOCHIPS TECHNOLOGY CO., LTD. (KR)

( * ) Notice: Subject to any disclaimer, the term of this patent is extended or adjusted under 35 U.S.C. 154(b) by 0 days.

(21) Appl. No.: 14/608,115

(22) Filed: Jan. 28, 2015

(65) Prior Publication Data

US 2015/0214916 A1    Jul. 30, 2015

(30) Foreign Application Priority Data

Jan. 29, 2014  (KR) .......................... 10-2014-0011099

(51) Int. Cl.
*H03H 7/01* (2006.01)
*H03H 1/00* (2006.01)

(52) U.S. Cl.
CPC .... *H03H 7/0115* (2013.01); *H03H 2001/0085* (2013.01)

(58) Field of Classification Search
CPC .................. H03H 7/0115; H03H 2001/0085
USPC ......................................... 257/531, 532, 686
See application file for complete search history.

(56) References Cited

U.S. PATENT DOCUMENTS

| | | | | |
|---|---|---|---|---|
| 5,197,170 A | * | 3/1993 | Senda | H01G 4/40 156/250 |
| 7,880,564 B2 | * | 2/2011 | Sasaki | H03H 1/00 333/168 |
| 2002/0009577 A1 | | 1/2002 | Takaya et al. | |
| 2006/0126239 A1 | | 6/2006 | Terada | |
| 2007/0001782 A1 | | 1/2007 | Sasaki et al. | |
| 2010/0141370 A1 | | 6/2010 | Lu et al. | |
| 2010/0182097 A1 | | 7/2010 | Hayashi et al. | |
| 2010/0200977 A1 | | 8/2010 | Sasaki et al. | |

FOREIGN PATENT DOCUMENTS

| | | |
|---|---|---|
| EP | 0581206 B1 | 1/2003 |
| JP | 3075003 A | 6/2000 |
| JP | 2005229434 A | 8/2005 |
| JP | 2005294486 A | 10/2005 |
| JP | 200821752 | 1/2008 |
| KR | 20110049200 | 5/2011 |

* cited by examiner

*Primary Examiner* — Karen Kusumakar

(57) ABSTRACT

The present disclosure relates to a stacked chip device including a first stack unit comprising a plurality of electrode patterns respectively disposed for a unit device region and common electrode patterns formed to be connected to cross the unit device regions, a second stack unit disposed on a top portion of the first stack unit and comprising a plurality of first conductor patterns, and a third stack unit disposed on a bottom portion of the first stack unit and comprising a plurality of second conductor patterns, wherein the first and second conductor patterns are formed on a plurality of sheets, the first and second conductor patterns formed on one sheet are formed across a plurality of unit device regions, and the first and second conductor patterns are connected vertically through vias formed penetrating through at least some of the sheets.

14 Claims, 6 Drawing Sheets

500 : 510, 520
510 : 511, 512
520 : 521, 522
700 : 711~713

STACKED CHIP DEVICE

CROSS-REFERENCE TO RELATED APPLICATION

This application claims priority to Korean Patent Application No. 10-2014-0011099 filed on Jan. 29, 2014 and all the benefits accruing therefrom under 35 U.S.C. §119, the contents of which are incorporated by reference in their entirety.

BACKGROUND

The present disclosure relates to a stacked chip device in which unit devices having different characteristics are combined to a single chip, and more particularly, to a stacked chip device undirected and having ensured reliability.

In an electronic device, representative passive devices include a resistor R, a capacitor C, and an inductor L, and functions and roles of these passive devices are various. For example, a resistor controls flow of a current flowing through a circuit and also plays a role of achieving impedance matching in an alternating current circuit. A capacitor basically plays a role of blocking a direct current and transmitting an alternating current signal, configures a time constant circuit, a delay circuit, an RC circuit, and an LC filter circuit, and removes noise for itself. An inductor performs functions of removing high frequency noise, and impedance matching.

In addition, due to varied resistance according to an applied voltage, a varistor device is widely used as a protection device for protecting important electronic components and circuits from overvoltage (a surge voltage) and static electricity. In other words, even though a current does not flow through a varistor device disposed inside a circuit, when overvoltage not smaller than a certain voltage or overvoltage due to lightening is applied on both terminals of the varistor, resistance of the varistor device rapidly decreases, almost all current flows through the varistor device and no current flows through other devices, and therefore the circuit is protected from the overvoltage. Such varistor devices are recently in a trend of being miniaturized and arrayed in order to protect a large-scale integrated circuit or the like from static electricity and overvoltage in response to miniaturization of electronic devices.

For example, important electronic components or circuits may be efficiently protected from overvoltage by combining the varistor device and a resistor device, and stable operation of the electronic components or circuits can be ensured by combining the varistor device and an inductor device to remove a noise component.

In such a way, when various unit devices are combined to one chip, a plurality of sheets are stacked in a vertical direction to manufacture a chip and conduction patterns including electrodes for realizing each device are formed on each sheet. At this point, a stacked chip device becomes to have directivity according to a horizontal arrangement or a vertical stack arrangement of unit devices. In other words, the stacked chip has directivity of different characteristics in the horizontal direction or the vertical direction. In this case, the stacked chip is required to be used in correspondence to the directivity when used in an electronic circuit, and a direction recognition mark is required to be indicated so that the directivity can be distinguished at the time of manufacturing the stacked chip. Accordingly, a manufacturing process becomes complex, caution is necessary in use thereof, and mounting task is delayed.

In addition, in the stacked chip device, a through-hole is formed which penetrates the conduction pattern on each sheet, and the conduction patterns are connected in a vertical direction by filling the through-hole with a conductor. At this point, since the chip is manufactured by stacking and compressing the plurality of sheets, stress is accumulated on a region where a through-hole is disposed, in particular, on a region where the through-hole is disposed in an overlapped manner, the conductor in the through-hole is modified, and a distance to a conduction pattern adjacent thereto becomes nearer than that originally designed. Accordingly, design characteristics of the stacked chip device are not properly realized. When the conductor in the through-hole becomes severely modified, electricity is partially concentrated to be short-circuited, to cause a leakage current, or to create a transient current.

Patent Literature 1: Korean Patent Laid-Open Publication No. 10-2011-0049200

SUMMARY

The present disclosure provides a stacked chip device undirected and excellent in usability.

The present disclosure also provide a stacked chip device capable of restricting or preventing a leakage current or a transient current, and ensuring reliability.

In accordance with an exemplary embodiment, a stacked chip device includes: a first stack unit comprising a plurality of electrode patterns respectively disposed for a unit device region and common electrode patterns formed to be connected to cross the unit device regions; a second stack unit disposed on a top portion of the first stack unit and comprising a plurality of first conductor patterns; and a third stack unit disposed on a bottom portion of the first stack unit and comprising a plurality of second conductor patterns, wherein the first and second conductor patterns are formed on a plurality of sheets, the first and second conductor patterns formed on one sheet are formed across a plurality of unit device regions, and the first and second conductor patterns are connected vertically through vias formed penetrating through at least some of the sheets.

The first and second conductor patterns may be formed on one sheet to cross at least two unit devices, the vias may include first central vias formed on central portions of the first conductor patterns, first end portion vias formed on end portions of the first conductor patterns, second central vias formed on central portions of the second conductor patterns, and second end portions via formed on end portions of the second conductor patterns, central axes of the first and second central vias may be separated from each other, and the first and second end portion vias may be separately disposed in a horizontal direction.

The first central vias and the first end portion vias may be formed alternately in a vertical direction, and the second central vias and the second end portion vias may be formed alternately in the vertical direction.

The stacked chip device may further include a plurality of first external terminals configured to be connected to parts of the plurality of electrode patterns and the plurality of first conductor patterns; a plurality of second external terminals configured to be connected to a remaining part of the plurality of electrode patterns and the plurality of second conductor patterns; and common external terminals connected to the common electrode patterns. The first and second external terminals are disposed alternately.

A width of one exposed end portion of the plurality of electrode patterns may be narrower than that of another end portion, and at least one of the end portions of the plurality of electrode patterns may be deviated from a central line configured to divide the electrode patterns into two parts.

The common electrode patterns may include non-conductor regions on at least parts of portions facing the vias.

In accordance with another exemplary embodiment, a stacked chip device includes: a first stack unit comprising a plurality of electrode patterns respectively disposed for a unit device region and common electrode patterns formed to be connected to cross the unit device regions; and conductor stack unit configured to be disposed on at least one side of a top portion and a bottom portion of the first stack unit and comprising a plurality of conductor patterns, wherein the conductor patterns are formed on a plurality of sheets and connected vertically through vias formed penetrating through at least some of sheets, and the common electrode patterns comprises non-conductor regions on at least parts of portions facing the vias.

The conductor stack units may include a second stack unit disposed on a top portion of the first stack unit and including a plurality of first conductor patterns; and a third stack unit disposed on a bottom portion of the first stack unit and including a plurality of second conductor patterns, wherein at least one of the first and second conductor patterns are formed on the plurality of sheets, and at least one of the first and second patterns are connected vertically through vias formed penetrating through at least some of sheets.

The common electrode patterns may include a top common electrode pattern formed on a top portion of the electrode patterns and a bottom common electrode pattern formed on a bottom portion of the electrode patterns, the top common electrode pattern may include a non-conductor region on a portion facing a first via configured to connect the first conductor pattern vertically, and the bottom common electrode pattern may include a non-conductor region on a portion facing a second via configured to connect the second conductor pattern vertically.

The common electrode patterns may include a top common electrode pattern formed on a top portion of the electrode patterns and a bottom common electrode pattern formed on a bottom portion of the electrode patterns, and the top common electrode pattern and the bottom common electrode pattern may include non-conductor regions on a portion facing a first via configured to connect the first conductor patterns vertically and on a portion facing a second via configured to connect the second conductor patterns vertically.

The first vias may include first central vias formed at central portions of the first conductor patterns and first end portion vias formed at end portions of the first conductor patterns, the second vias may include second central vias formed at central portions of the second conductor patterns and second end portion vias formed at end portions of the second conductor patterns, and the first and second end portion vias may be separately disposed at different positions in a horizontal direction.

The electrode patterns may include non-conductor regions on at least parts of portions facing the vias.

The common electrode patterns may be formed on a sheet, and the non-conductor regions may include regions in which parts of the common electrode patterns are removed and the sheet is exposed. In addition, the non-conductor regions comprise insulation layers configured to cover parts of the common electrode patterns. Furthermore, the non-conductor regions may be formed with a size that is the same as or greater than that of the vias.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
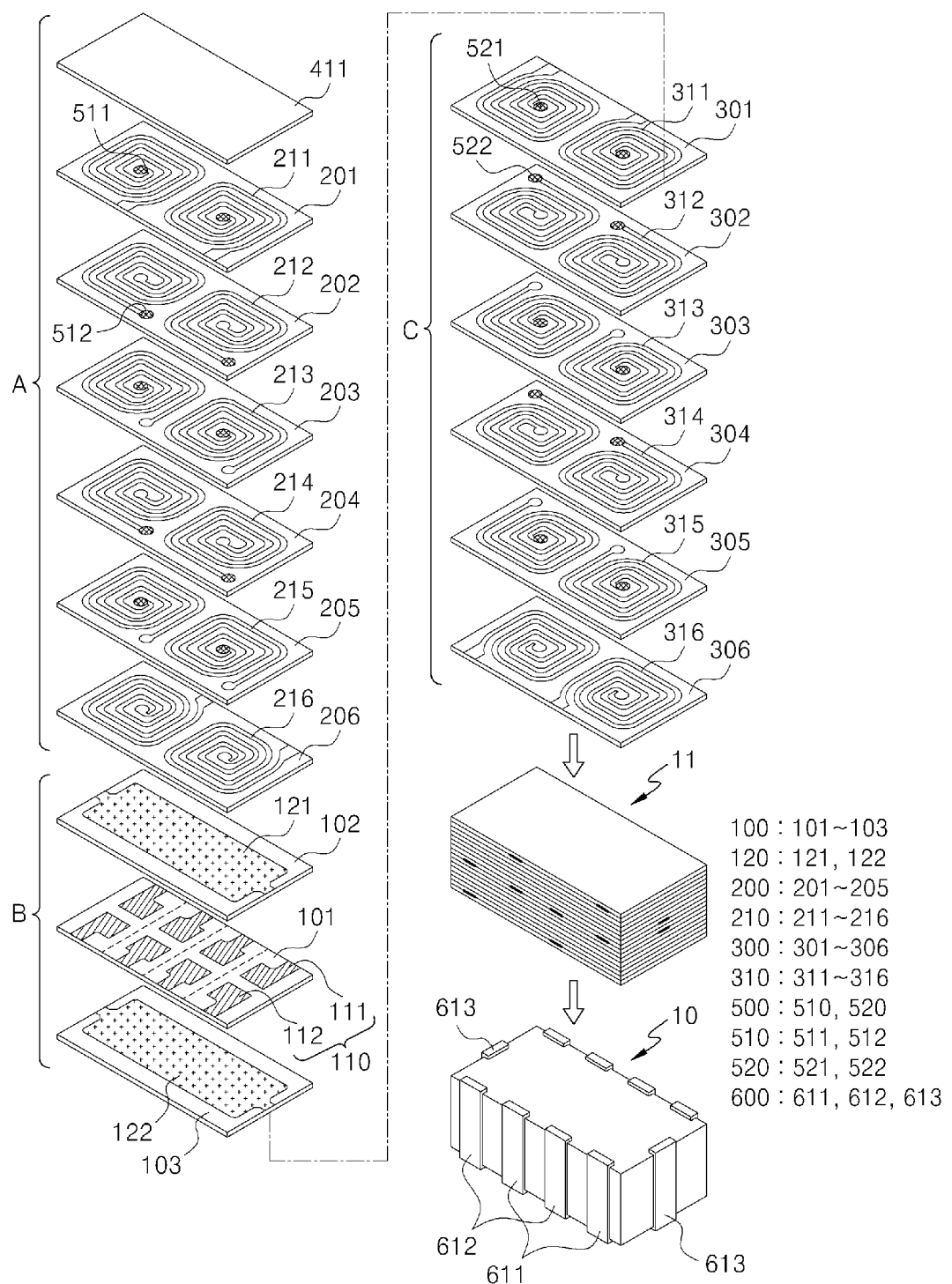
FIG. 1 is an exploded perspective view and appearances schematically illustrating a stacked chip device in accordance with an exemplary embodiment.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of elements are exaggerated or enlarged for clarity of illustration. Like reference numerals refer to like elements throughout.

Figure 2:
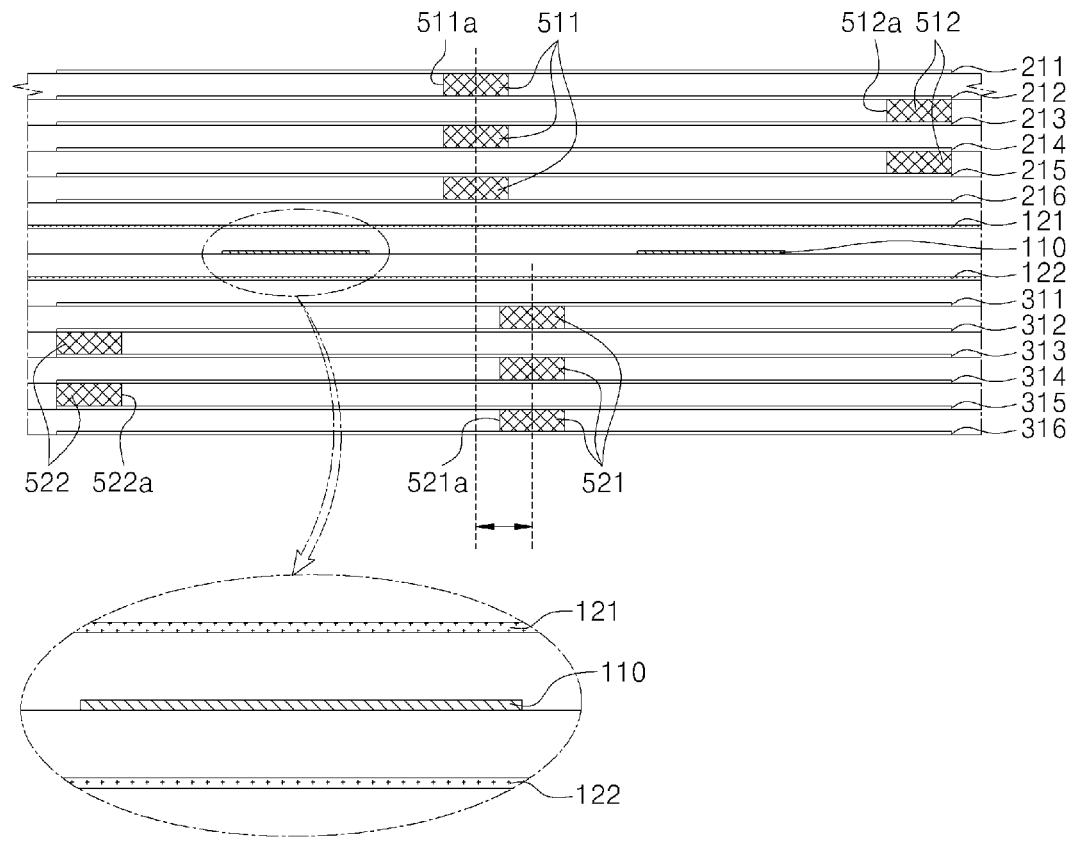
FIG. 2 is a conceptual cross-sectional view for explaining an internal pattern of the device of FIG. 1.
Figure 3:
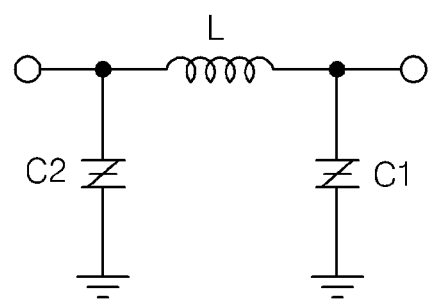
FIG. 3 is an equivalent circuit diagram of a unit device in the device of FIG. 1.

FIG. 1 is an exploded perspective view and an appearance schematically illustrating a stacked chip device in accordance with an exemplary embodiment, and FIG. 2 is a cross-sectional conceptual view illustrating an internal pattern of the device of FIG. 1. In other words, FIG. 2 is a cross-sectional conceptual view cut vertically along an extended direction of a conductor pattern in order to show the internal cross-section of a conductor pattern. FIG. 3 is an equivalent circuit diagram of a unit device in the device of FIG. 1.

Referring to FIGS. 1 and 2, a stacked chip device 10 according to an exemplary embodiment includes a first stack unit B including a plurality of electrode patterns 110 disposed for each unit device region and a common electrode pattern 120 formed to be connected to cross the unit device regions, and conductor stack units A and C disposed on at least one side of the top portion and the bottom portion of the first stack unit B and including a plurality of conductor patterns 210 and 310, wherein the conductor patterns 210 and 310 are formed on the plurality of sheets 200 and 300 and connected vertically through vias 500 formed penetrating through at least a part of the sheets. In addition, the conductor stack units A and C may include the second stack unit A disposed on the top portion of the first stack unit B and having the plurality of first conductor patterns 210 and may include a third stack unit C disposed on the bottom portion of the first stack unit B and having the plurality of second conductor patterns 310. In other words, the conductor stack units A and C may be disposed only on the top portion or the bottom portion of the first stack unit B, or may be disposed on both the top and bottom portions. Furthermore, the first stack unit B and the conductor stack units A and C may be stacks 11 in which a device having desired properties is implemented. For example, the first stack unit B is a stack in which a plurality of capacitors are disposed, and the conductor stack units A and C are stacks in which a plurality of inductors are disposed. Sheets used in each of the stack units are stacked sheets, each of which has each pattern formed thereon and is stacked, and may be a ceramic material or another material, for example, a semiconducting ceramic sheet, an insulating ceramic sheet, or a varistor material sheet. Furthermore, sheets of an identical material may be used in an entire stack or sheets of different materials may be used for each stack unit.

The first stack unit B is a stack in which sheets 101 on which a plurality of patterns 110 respectively disposed for unit device region (indicated with dotted lines) are formed, and sheets 102 and 103 having common electrode patterns 120 formed to be connected to cross the unit device region are stacked, and the number of stacked sheets is not limited. For example, as illustrated in FIG. 1, sheets having the common electrode patterns may be stacked only on the top portion or the bottom portion around the sheet 101 having the electrode pattern 110 formed thereon, or sheets 102 and 103 having the common electrode patterns 121 and 122 may be respectively stacked on the top and bottom portions.

Figure 5:
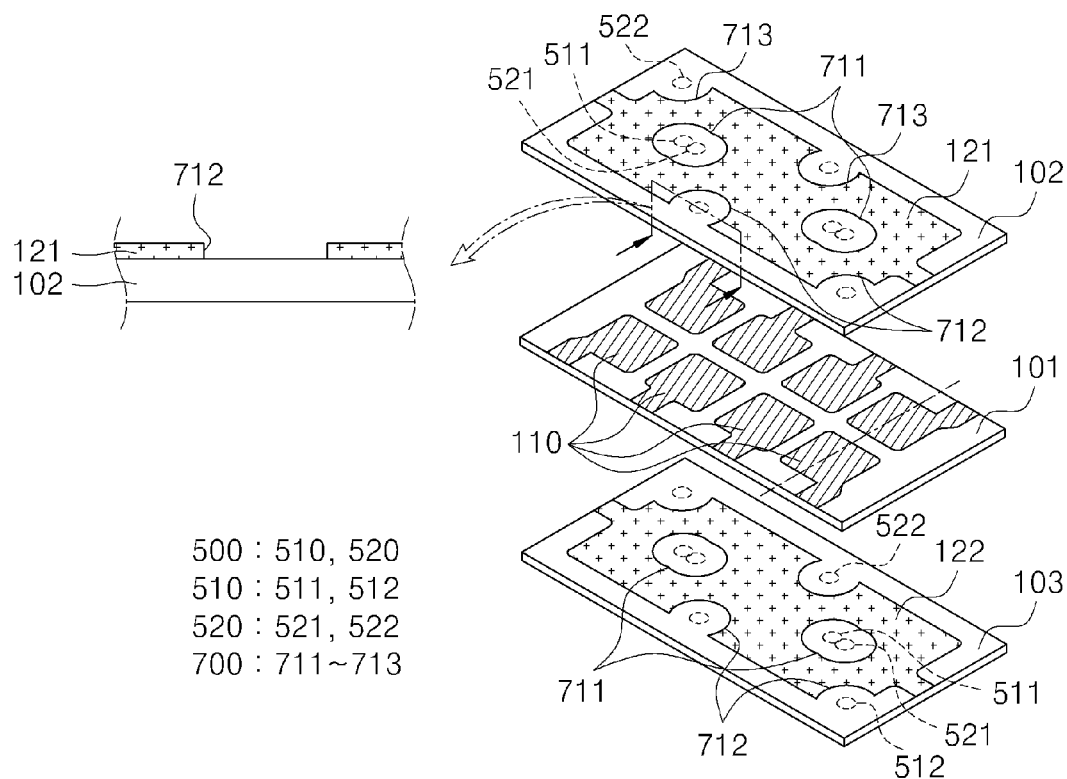
FIG. 5 is an exploded perspective view illustrating in detail the first stack unit of the device of FIG. 4.

The plurality of electrode patterns 110 and the common electrode patterns 121 and 122 are internal electrodes facing each other with a sheet in-between, and form a capacitor for each unit device. The plurality of electrode patterns 110 formed on one sheet include a pair of electrodes 111 and 112 facing each other for each unit device, and the electrodes 111 and 112 are separated from each other. The electrode pattern 110 is formed to have a predetermined area, and the shape thereof is not particularly limited. Namely, as illustrated, the shape may be a quadrangle shape or another different shape. The electrode pattern 110 is extended to one side of the sheet 101 inside the sheet 101 and exposed externally at the one side of the sheet 101. For example, the electrode pattern 110 is extended in a short side direction and exposed at a long side of the sheet 101. The exposed end portion of the electrode pattern 110 is connected to an external terminal 600 to be described later. At this point, a width of the exposed one end portion of the plurality of electrode patterns 110 may be smaller than that of another end portion, and accordingly, an interval between the end portions of the electrode patterns 110 is increased to expose the end portions. When the exposed end portions are connected to the external terminal 600, their connections to each other may be restricted. At least one of the one end portions of the plurality of electrode patterns may be positioned deviated from a central line dividing the electrode pattern 110 into two parts, as illustrated in FIG. 5. Accordingly, the interval between the electrode patterns 110 may be widened and adjusted uniformly. In addition, a capacitance value may be adjusted by adjusting the areas of the electrode patterns 110.

The common electrode patterns 120 are formed to be connected to cross the unit device regions divided on the sheet. The common electrode patterns 120 may function as a common electrode connected for each unit device, and may be connected to a common external terminal 613, namely, the ground terminal. The electrode patterns 110 may be connected to other separate external terminals for each unit device, but the common electrode pattern may be connected to the common ground. The shape and area of the common electrode patterns 120 are not particularly limited, and it is sufficient to face the electrode patterns 110 formed at each unit device region and have overlapping areas. For example, as illustrated in the drawing, the common electrode patterns 120 have a quadrangle shape similar to that of one sheet and are exposed at end portions of the sheet. Namely, the common electrode patterns 120 may be extended along a long side direction of the sheet and exposed externally at both short sides of the sheet.

The common electrode patterns 120 may be installed separately vertically from the electrode patterns 110 to form a capacitor, and change a capacitance value by adjusting the number of installations and positions thereof. In addition, the common electrode pattern 120 may include non-conductor region on at least a part of a portion facing the vias 500.

The conductor pattern, namely, the first and second conductor patterns 210 and 310 are formed on the plurality of sheets 200 and 300, the first and second conductor patterns 210 and 310 formed on one sheet are formed across the plurality of unit device regions, and the first and second patterns 210 and 310 are vertically connected through the vias 500 formed penetrating through at least a part of sheets. The conductor patterns 210 and 310 are the conductor lines extended lengthily and extended horizontally and vertically. At this point, the conductor patterns 210 and 310 formed of long lines may function as an inductor having a predetermined resistance value (for example, 50Ω). When the lengths of the conductor patterns 210 and 310 are extended, the resistance values may be increased. For example, the resistance value may be adjusted in a range from several ohms to tens of ohms by changing the number of stacks of the sheets 200 and 300 on which the conductor patterns 210 and 310 are formed. Furthermore, the conductor patterns 210 and 310 may be formed across the unit device regions, not formed for each unit device region on one sheet. For example, as illustrated in FIG. 1, the first and second conductor patterns 210 and 310 may be formed to cross at least two unit device regions on one sheet. In other words, one conductor pattern may be formed on an area corresponding to the two unit device regions around the first stack unit B. Accordingly, the area and the number that the unit device (one pair of capacitors) occupies on one sheet in the first stack unit B may be different from those that the unit device (one inductor) occupies on one sheet in the conductor stacks A and C. For example, 4 electrode patterns (4 pairs of capacitors) are disposed in the horizontal direction in the first stack unit B, and conduction patterns (one inductor) are disposed by two in the horizontal direction and by two in the vertical direction in the conductor pattern units A and C. Accordingly, two among the electrode patterns on an identical plane are connected to two conductor patterns (namely, the two first conductor patterns 210) on the top portion side, and the other two among the electrode patterns are connected to two conductor patterns (namely, the two second conductor patterns 310) to respectively form a unit device including a pair of capacitors and one inductor. At this point, the electrode patterns 110 and the conductor patterns 210 and 310 are connected through the external terminals 600. In other words, a part (even numbered electrode patterns) of the plurality of electrode patterns 110 and the plurality of first conductor patterns 210 may be connected to a plurality of first external terminals 611, and the remaining part (odd numbered electrode patterns) and the plurality of second conductor patterns 310 may be connected to the plurality of second external terminals 612. At this point, the first and second external terminals 611 and 612 may be formed on external side surfaces in a long side direction of the stacked chip device, and disposed alternately along the side surfaces.

In addition, when the first conductor patterns 210 and the second conductor patterns 310 are disposed vertically with the first stack unit B in-between, they may be disposed symmetrically facing each other, and areas that respectively occupied by one of the first conductor patterns 210 and one of the second conductor patterns 310 may be identical or similar. At this point, the exposed end portion of the first conductor patterns 210 and the exposed end portion of the second conductor patterns 310 may be disposed at different positions in the horizontal direction and alternately exposed in the horizontal direction.

The conductor patterns, namely, the first conductor patterns 210 and the second conductor patterns 310 may be formed in a spiral type, a meander, a zig-zag type, or the like, formed in plurality (e.g., two) in the horizontal direction, and connected through the vias 500 formed penetrating through the plurality of sheets in the vertical direction. Via holes (511a, 512a, 521a, 522a) penetrating vertically are formed penetrating through at least a part of sheets on which the conductor patterns are formed, the internal side of the via holes are filled with a conductor material to form the vias 500, and accordingly the vias 500 may electrically or physically connect the conductor patterns on the upper and lower sheets.

The vias 500 may be formed with the minimum number according to the shapes of the conductor patterns 210 and 310, and may be formed separately or alternately in the horizontal direction and vertical direction (up and down direction). For example, the vias 500 may include first vias 510 vertically connecting the first conductor patterns 210 and second vias 520 vertically connecting the second conductor patterns 310. Furthermore, the first vias 510 may include first central vias 511 formed at central portions of the first conductor patterns 210, and first end portion vias 512 formed at end portions of the first conductor patterns 210, and the second vias 520 may include second central vias 521 formed at central portions of the second conductor pattern 310 and second end portion vias 522 formed at end portions of the second conductor patterns 310. Here, a vertical central axis of the first central via 511 and a vertical central axis of the second central via 521 may be separately disposed in the horizontal direction, and the first end portion vias and the second end portion vias may be separately disposed in the horizontal direction. In other words, the first and second end portion vias may be formed at different positions in the horizontal direction. In addition, the first central vias 511 and the first end portion vias 512 are formed alternately in the vertical direction, and the second central vias 521 and the second end portion vias 522 may be formed alternately in the vertical direction. Accordingly, each via 500 may be formed with only one or not be formed with respect to each conductor pattern of one sheet. In other words, in the second and third stack units B and C on which the first and second conductor patterns 210 and 310 are formed, the sheets 206 and 306 of the lowest layers among the sheets 200 and 300 with the conductor patterns formed thereon do not have vias, and the remaining sheets 201 to 205 and 301 to 305 respectively have one via formed for each conductor pattern. In addition, the vias are not formed in an overlapped manner at an identical position in the vertically adjacent sheets, and the first vias 510 formed in the second stack unit A positioned on the top portion and the second vias 520 formed in the third stack unit C positioned on the bottom portion around the first stack unit B are not formed at the identical position in the horizontal direction. Such a dispersed distribution of vias reduces the vias overlapped in the vertical direction, and accordingly reduces modification of the vias even when the sheets are stacked and compressed. Furthermore, various electrical characteristics may be maintained by reducing the modification of the vias.

When including spiral conductor patterns and vias alternately formed at the central portions and end portions thereof, as illustrated in FIGS. 2 and 3, for example, the first conductor patterns 210 are formed by two on one sheet in the horizontal direction. Each of the first conductor patterns 210 includes, in the vertical direction, 1-1 conductor patterns 211 formed on a first sheet 201, 1-2 conductor patterns 212 formed on a second sheet 202, 1-3 conductor patterns 213 formed on a third sheet 203, 1-4 conductor patterns 214 formed on a fourth sheet 204, 1-5 conductor patterns 215 formed on a fifth sheet 205, and 1-6 conductor patterns 216 formed on a sixth sheet 216. Furthermore, a part of such patterns, more specifically, the 1-1 conductor patterns 211 and the 1-6 conductor patterns 216 have their end portions exposed externally and connected to the external terminal 600. In addition, the first central vias 511 are formed at the central portions of the first conductor patterns in the first, third, and fifth sheets 201, 203, and 205, and the first end portion vias 512 are formed at the end portions of the first conductor patterns in the second and fourth sheets 202 and 204. Accordingly, the 1-1 to 1-6 conductor patterns 211 to 216 may be connected through the first central vias 511 and the first end portion 512 and form one line structure. The second conductor patterns 310 and the second vias 520 are formed in the identical structure and description thereof is omitted.

In addition, the stacked chip device 10 includes the external terminals 600 at external surfaces of the stacks 11 in which the first stack B, the second stack A, and the third stack C are stacked. The common electrode patterns 121 and 122 are connected to the common external terminals 613 at side surfaces in the short side direction of the stacked chip, even-numbered patterns among the electrode patterns 110 and the exposed end portions of the first conductor patterns 210 are connected to first external terminals 611 at the side surfaces in a long side direction of the stacked chip, and odd-numbered patterns among the electrode patterns 110 and the exposed end portions of the second conductor patterns 310 are connected to second external terminals 612 at side surfaces in the long side direction of the stacked chip.

The conductor patterns 210 and 310 functioning as an inductor L are connected to the first and second external terminals 611 and 612 in the stacked chip, an equivalent capacitor C1 is formed by one side electrode 111 connected to one side surface terminal of the first and second external terminals 611 and 612 and the common electrode pattern 120 connected to the common external terminal 613, and an equivalent capacitor C2 is formed by another side electrode 112 connected to another side surface terminal of the first and second external terminals 611 and 612 and the common electrode pattern 120 connected to the common external terminal 613. Accordingly, as illustrated in FIG. 3, each unit device in the stacked chip device may be manufactured with a π type inductor-capacitor (LC) filter in which capacitors C1 and C2 are respectively connected to both sides of the inductor L. Of course, when the sheets having the electrode patterns 110 and the common electrode patterns 120 formed thereon are adopted with sheets of a varistor material, a π type inductor-varistor (LV) filter may be manufactured. Furthermore, an equivalent π type ESD filter for preventing static electricity may be manufactured by adopting the first and second external terminals 611 and 612 as an input or output stage, and using the common external terminal 613 as the ground.

Furthermore, the stacked chip device has a π type structure and is symmetric in horizontal direction and also symmetric in vertical direction by disposing the second stack unit A and the third stack unit C respectively functioning as an inductor layer on the top and bottom portions around the first stack unit B functioning as a capacitor layer. Accordingly the stacked chip device is undirected and does not need a direction recognition mark, and may perform easily an installation task at the time of implementing an electronic circuit.

Hereinafter, a manufacturing method of the stacked chip device is briefly described.

First, molding sheets are prepared for allowing each pattern to be formed thereon and a space between patterns to be separated vertically. In other words, the molding sheets are stacked and then plasticized to be sheets in the device. The aforementioned sheets is better to be formed in a quadrangle shape, but is not limited hereto and a polygonal shape including a square or a pentagon, a circular shape, or a elliptical shape is possible according to use of a finally manufactured complex stacked chip device. A molding sheet for a desired device is manufactured. In other words, varistor molding sheets are manufactured for manufacturing varistors, capacitor molding sheets are manufactured for manufacturing capacitors, and inductor molding sheets are manufactured for manufacturing inductors. In an exemplary embodiment, varistor molding sheets are used which normally function as a capacitor and the resistance is rapidly changed at the time of overvoltage. To the end, raw material powder of a varistor device commercially available for industrial use is used or raw material powder is prepared by ball-milling a desired composition in which an additive such as $Bi_2O_3$, CoO, MnO or the like is added to ZnO powder for 24 hours with a solvent such as water or alcohol. In order to prepare the molding sheets, PVB based binder, as an additive, is measured by about 6 wt % in contrast to the raw material powder, dissolved in toluene/alcohol based solvent and then added to the prepared varistor powder. Then, slurry is manufactured by milling and mixing for about 24 hours with a small ball mill, and the molding sheets having desired thicknesses is manufactured from the slurry in a doctor blade method, or the like. At this point, the molding stack sheets having desired thickness may also be manufactured from raw material powder having a capacitor composition and raw material powder having a thermistor device composition in the aforementioned method. In addition, typical insulating molding sheets may also be used, and semiconducting molding sheets may be used. Beside, dummy sheets having ferrite patterns printed thereon may be used as the inductor molding sheets. Alternatively, the inductor molding sheets such as separate ferrite sheets may be separately manufactured. In addition, identical material molding sheets may be used for each stack unit, or another material molding sheets may also be used. In the exemplary embodiment, varistor molding sheets of identical material are used in entire stack units. At this point, through-holes penetrating vertically may be installed in some molding sheets by using a punching device.

The electrode patterns 110, the common electrode patterns 120 and the conductor patterns 210 and 310 are formed by printing a conductive paste containing materials such as Ag, Pt, Pd, Ag—Pd, Ni—Cr, $RuO_2$ and the like in a screen printing scheme on each of the manufactured molding sheets by using a screen of a pattern particularly designed. In other words, the electrode patterns 110 and the common electrode patterns 120 are printed on the molding sheets 101, 102 and 103 to be the first stack unit by using the silk screen and the conductive paste, and the conductor patterns 210 and 310 are printed on the molding sheets 210 to 206 and 301 to 306 to be the second and third stack units. At this point, the through-holes are filled by burying the conductive paste in the through-holes.

The molding sheets having each pattern printed thereon are stacked to be structures of the first to third stack units B, A, and C, as exemplarily illustrated in FIG. 1. In addition, a dummy molding sheet 411 for protecting the stack units is stacked on the highest portion. Through the stacks, a part of the electrode patterns 110 and the common electrode patterns 120 are overlapped and the first and second conductor patterns 210 and 310 are connected to each other through the filled conductor inside the through-holes, namely, vias.

The stacked stacks are compressed and cut in a proper size. For example, when the unit device is individually cut, the unit device is cut as a single chip. When a plurality of devices are periodically cut, a plurality of devices are cut as a single chip. In other words, as illustrated in FIG. 1, when cut to allow four unit devices to be disposed, the four unit devices disposed in parallel may be cut as an array type single chip. In practical, massive production may be possible, when patterns formed in one device are formed to appear repetitively in plurality on one sheet, those sheets are stacked, and then the stacked sheets are cut in the desired device size, for example, cut as illustrated in FIG. 1, In order to remove all organic components such as various binders inside the cut stack, the cut stacks are baked out by heating at about 300° C. and a temperature is increased to burn the cut stacks at a proper burning temperature (e.g., about 1100° C.).

The external terminals 600, which are connected to each electrode pattern, the common electrode patterns, and the conductor patterns inside the stack, are installed outside the burnt stacks to complete the stacked chip device. According to the number and positions of electrode terminals to be formed (the number of external terminals printed on side surfaces of the burnt stacks, for example four or one), Ag-paste is coated on a rubber disc having a groove on a circumferential surface, the rubber disc has a closely contact with a small body and is rotated (dipping operation) to print electrodes. Then external terminals are manufactured and burnt at a proper temperature. In the above description, one chip formed of four unit devices are exemplified, but it is not limited hereto. In addition, in the above description, even though it is exemplified that the conductor patterns of the second and third stack units on the top and bottom portions of the first stack unit are connected vertically by vias formed penetrating through the sheet, the conductor patterns may be connected in other various schemes.

Figure 4:
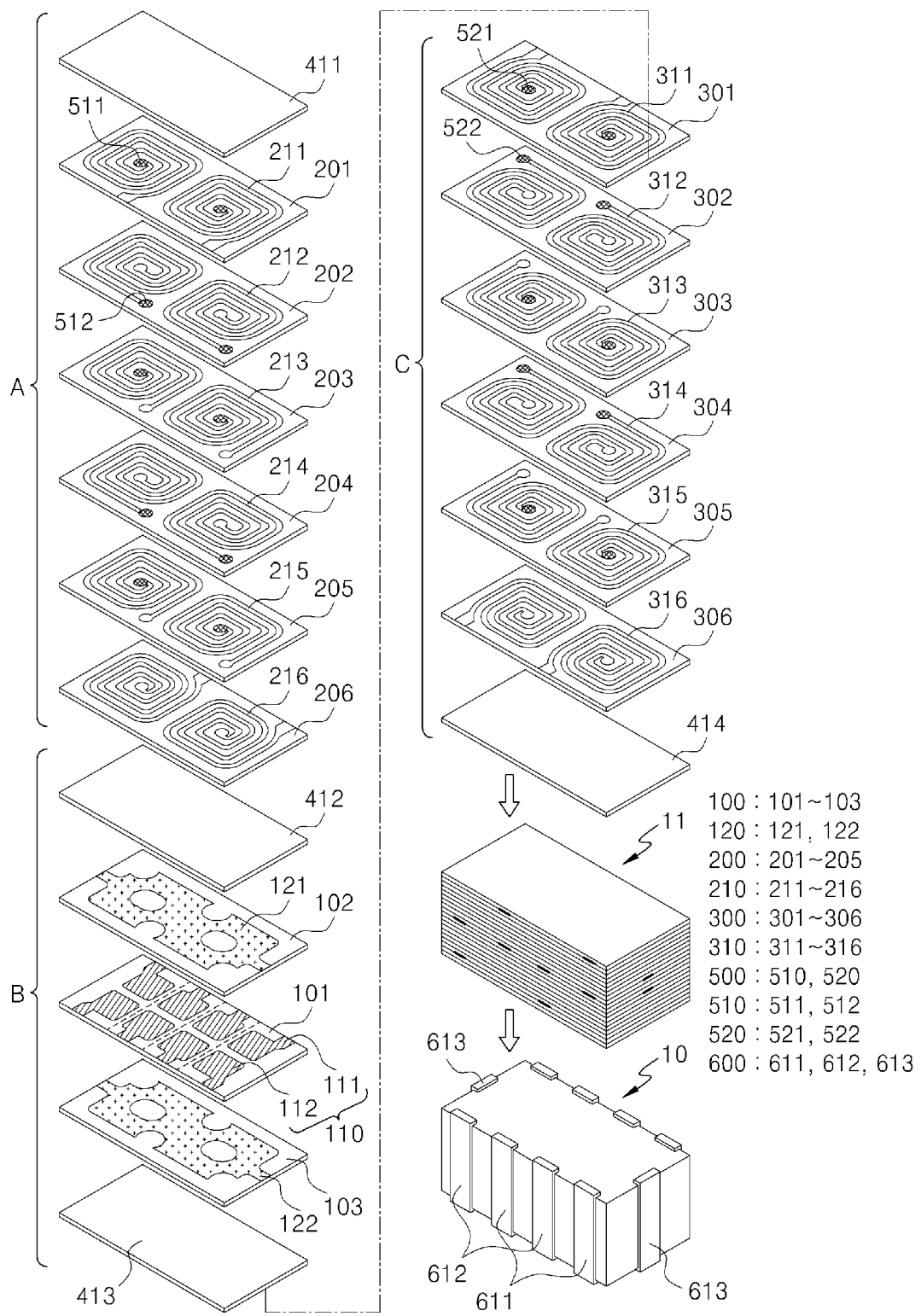
FIG. 4 is an exploded perspective view and appearance schematically illustrating a stacked chip device in accordance with another exemplary embodiment.

Hereinafter, description is provided for another embodiment in which the first stack B and a stack structure are changed. FIG. 4 is an exploded perspective view and an appearance illustrating a stacked chip device according to the other embodiment, and FIG. 5 is an exploded perspective view illustrating in detail the first stack unit of the device of FIG. 4. Most of structures including a basic structure of each stack unit of the embodiment are identical and description about the identical part is omitted.

The stacked chip device according to the other embodiment includes a first stack unit B having a plurality of electrode patterns respectively disposed for each unit device region and common electrode patterns formed to be connected to cross the unit device regions, and a conductor stack unit positioned on at least one side of the top and bottom portions of the first stack unit B and including a plurality of conductor patterns, wherein the conductor patterns are formed on a plurality of sheets, connected vertically through vias formed penetrating through at least a part of sheets, and the common electrode patterns include non-conductor regions on at least parts of portions facing the vias. Here, the conductor stack unit may include a second stack unit A positioned on the top portion of the first stack unit B and having a plurality of first conductor patterns 210, and a third stack unit C positioned on the bottom portion of the first stack unit B and having a plurality of second conductor patterns 310. At least one of the first and second conductor patterns 210 and 310 may be connected vertically through vias formed penetrating through at least some of the sheets.

The common electrode patterns 110 may have a top common electrode pattern 121 formed on the top side of the common electrode pattern 110 and a bottom common electrode pattern 122 formed on the bottom side of the electrode pattern 110, and may be separated from edges of the sheets 102 and 103 to be almost entirely formed, and then both end portions thereof may be formed to edges of the sheets and exposed externally. Furthermore, the common electrode patterns 120 also include non-conductor regions 700 at portions in which vias 500a separately installed at the top portion or the bottom portion face each other. For example, as illustrated in FIG. 5, the top common electrode pattern 121 and the bottom common electrode pattern 122 include the non-conductor regions at a portion facing the first vias 510 connecting the first conductor patterns 210 vertically and at a portion facing the second vias 520 connecting the second conductor patterns 310 vertically. In other words, the first non-conductor region 712 is formed at the portion facing the first end portion vias 512, a second non-conductor region 713 is formed at the portion facing the second end portion vias 522, and a central non-conductor region 711 may be formed at a portion in which a first central end portion 511 and a second central end portion 521 face each other. Here, the non-conductor regions 700 are insulation regions through which electricity is not transmitted, and may include a region in which parts of the common electrode patterns 121 and 122 are removed and bottom sheets 102 and 103 are exposed. In other words, the common electrode patterns may be removed at regions in which the vias 500 and the common electrode patterns are overlapped. In such a way, when the non-conductor regions 700 are installed on the common electrode patterns 120 in correspondence to the vias 500, even though a stack is compressed to press or modify the vias 500 at the time of manufacturing the stacked chip device, since the non-conductor regions 700 installed on the common electrode pattern adjacent to vias 500 are insulating regions, a leakage current or a transient current may be restricted or prevented from occurring, or short-circuits between the vias and the common electrode patterns may be restricted or prevented.

Furthermore, the non-conductor regions 700 may be formed to have the same size as or greater than that of the vias 500. For example, the diameter of the vias 500 may be in a range from approximately 30 to approximately 150 μm and at this point, the diameter of the non-conductor regions 700 may be in a range from approximately 30 to approximately 300 μm, or in a range from approximately 50 to approximately 250 μm. Furthermore, a size ratio of the vias 500 and the non-conductor regions 700 may be in a range from 1 to 10 times, and a diameter ratio of the vias 500 and the non-conductor regions 700 may be in a range from 1.5 to 9 times. When the size of the vias is smaller than that of the non-conductor regions, the insulation function is not sufficient. When the size of the vias is excessively greater than that of the non-conductor regions, the insulation function is sufficient and the area of the common electrode patterns is reduced and the capacitance value thereof is reduced.

Furthermore, the stacked chip device of the exemplary embodiment has dummy sheets 412 and 413 respectively installed between the first and second stack units B and A, and between the first and third stack units B and C. When the dummy sheets are installed, an interval between each of the stack units is increased and accordingly interference in-between can be restricted or prevented. Of course, by removing the dummy sheets instead of adding them, thicknesses of the sheets positioned at the boundaries between the stack units may be increased. In other words, thicknesses of the lowest layer sheet 122 of the first stack unit B and the lowest layer sheet 206 of the second stack unit A may be allowed to be thicker, for example, double or more times, than those of other sheets. In addition, the stacked chip device may include the dummy sheet 414 even at the lowest portion of the entire stack.

Figure 6:
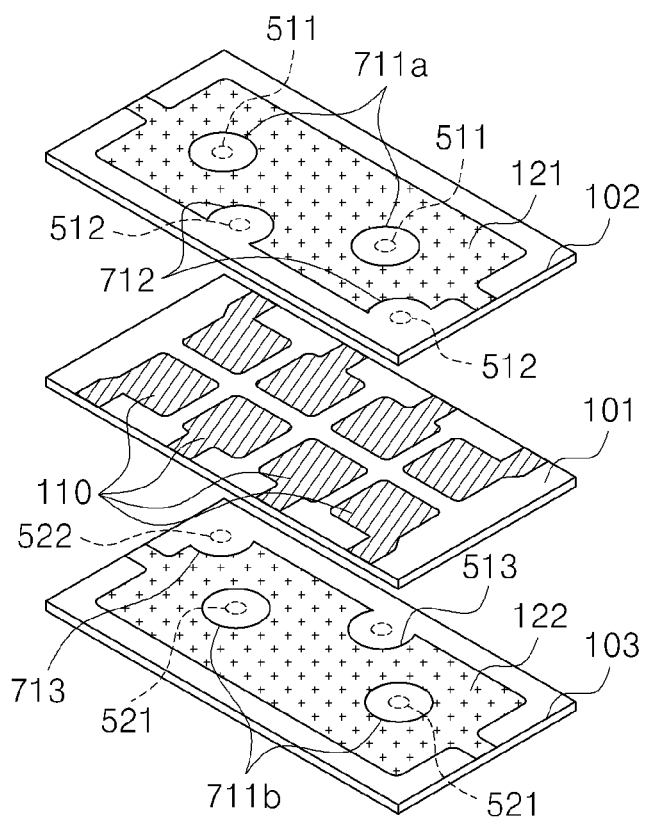
FIGS. 6 and 7 are exploded perspective views illustrating in detail the first stack unit of the stacked chip device according to a modification example of the exemplary embodiment.
Figure 7:
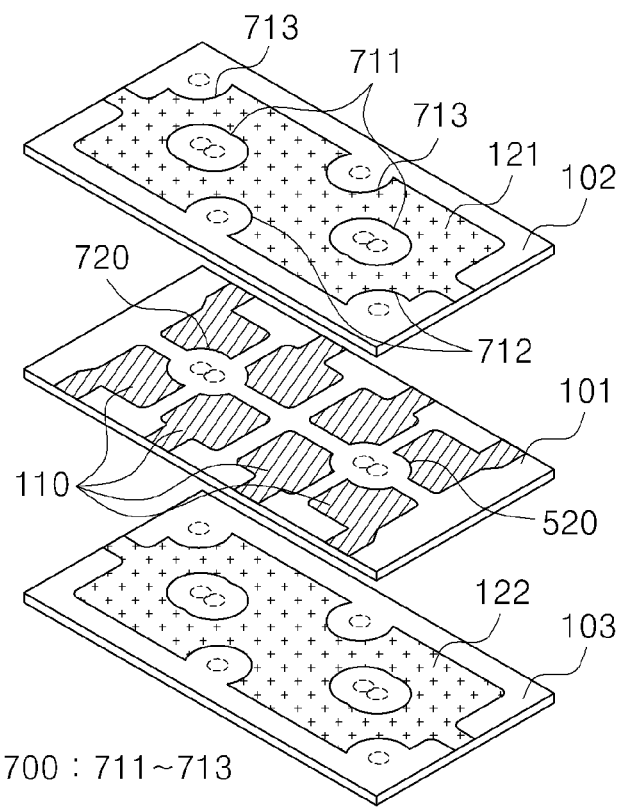
Figure 8:
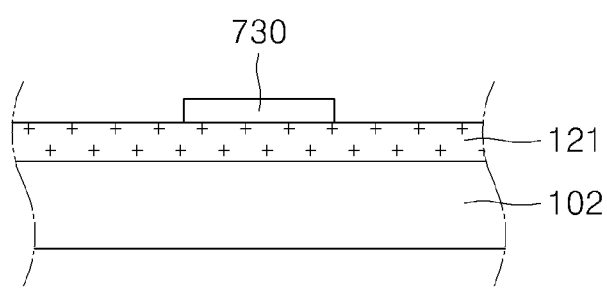
FIG. 8 is a cross-sectional view illustrating in detail a non-conductor region in the stacked chip device according to an modification example of the exemplary embodiment.

Hereinafter, modification examples in which the structure of the non-conductor regions is changed are described. FIGS. 6 and 7 are exploded perspective views illustrating in detail a first stack unit of the stacked chip device according to a modification example of an exemplary embodiment. FIG. 8 is a cross-sectional view illustrating in detail a non-conductor region in the stacked chip device according to a modification example of the exemplary embodiment. In the stacked chip devices of the modification examples, most of structures including a basic structure are identical and description about the identical part is omitted.

Referring FIG. 6, the top common electrode pattern 121 includes non-conductor regions 711a and 712 at portions facing first vias 510 (511 and 512) connecting the first conductor patterns vertically, and non-conductor regions 711b and 713 at portions facing second vias 520 (521 and 522) connecting the second conductor patterns vertically. In other words, the non-conductor regions are installed only at portions corresponding to vias adjacent to each common electrode pattern. From this, while insulation function is sufficient for the modification of the vias, the area of the common electrode patterns may be maintained and reduction of a capacitance value may be restricted.

Referring FIG. 7, the non-conductor regions may be installed not only on the common electrode patterns but also on electrode patterns. The electrode patterns 110 may include the non-conductor regions 720 on at least parts of portions facing the vias 500. In other words, a part of the electric pattern 110 may be removed to expose an insulation sheet 101 in the bottom portion. Accordingly, the insulation function for modification of the vias can be more increased. However, since area reduction of the electrode patterns 110 greatly affects the capacitance value, it is better to form the non-conductor regions 720 with a smaller area.

In the aforementioned description with reference to FIG. 8, even though the non-conductor regions are manufactured in a scheme of removing parts of the common electrode patterns or the electrode patterns, other schemes may be adopted. For example, the non-conductor regions may include an insulation layer covering parts of the common electrode patterns or the electrode patterns. In other words, the insulation layer 730 may be installed which coats an insulation material on the top portion of the common electrode pattern region desired to install the non-conductor region. At this point, the insulation material may be the same material as or a different material from that of the sheets.

Besides the examples, various modifications to the non-conductor regions are possible and the exemplified embodiments and modification examples can be combined and changed in various schemes.

According to embodiments, via modification can be reduced by adjusting arrangements of vias connecting upper and lower conductor patterns at the time of manufacturing a stacked chip device. In addition, a non-conduction region is formed in an internal electrode pattern in correspondence to a region where vias are intensively disposed in the stacked chip device. Accordingly, a short-circuit, a leakage current, and a transient current can be restricted or prevented in the stacked chip device, and originally designed characteristics thereof can be implemented. In such a way, since electrical characteristics are maintained and implemented as designed, device reliability can be ensured.

Furthermore, since unit devices are disposed symmetrically horizontally and vertically in the stacked chip device according to embodiments, the stacked chip device can be used as being undirected with respect to the horizontal and vertical directions. In other words, the stacked chip device may be used in implementing an electronic device without selection or recognition, and accordingly improve usability without causing miss-insertion in mounting.

Furthermore, desired electrical characteristic values can be easily controlled by adjusting arrangement, areas, shapes, the number of stacks or the like of conduction patterns or electrode patterns in the stacked chip device.

Furthermore, the stacked chip device according to embodiments can be manufactured without a process of inserting a direction recognition mark and with a simple manufacturing process without adding other additional processes, thereby improving productivity and reducing a manufacturing cost.

Although the stacked chip device has been described with reference to the specific embodiments, it is not limited thereto. Therefore, it will be readily understood by those skilled in the art that various modifications and changes can be made thereto without departing from the spirit and scope of the present invention defined by the appended claims.

What is claimed is:

1. A stacked chip device comprising:
   a first stack unit comprising a plurality of electrode patterns respectively disposed for a unit device region and common electrode patterns formed to be connected to cross the unit device regions;
   a second stack unit disposed on a top portion of the first stack unit and comprising a plurality of first conductor patterns; and
   a third stack unit disposed on a bottom portion of the first stack unit and comprising a plurality of second conductor patterns,
   wherein the first and second conductor patterns are formed on a plurality of sheets, the first and second conductor patterns formed on one sheet are formed across a plurality of unit device regions, and the first and second conductor patterns are connected vertically through vias formed penetrating through at least some of the sheets, and
   wherein the vias comprise first central vias formed on central portions of the first conductor patterns and second central vias formed on central portions of the second conductor patterns, and central axes of the first and second central vias are separated from each other.

2. The stacked chip device of claim 1, wherein the first and second conductor patterns are formed on one sheet to cross at least two unit devices, the vias further comprises first end portion vias formed on end portions of the first conductor patterns and second end portion vias formed on end portions of the second conductor patterns,
   the first and second end portion vias are separately disposed in a horizontal direction.

3. The stacked chip device of claim 2, wherein the first central vias and the first end portion vias are formed alternately in a vertical direction, and
   the second central vias and the second end portion vias are formed alternately in the vertical direction.

4. The stacked chip device of claim 1, further comprising
   a plurality of first external terminals configured to be connected to parts of the plurality of electrode patterns and the plurality of first conductor patterns;
   a plurality of second external terminals configured to be connected to a remaining part of the plurality of electrode patterns and the plurality of second conductor patterns; and
   common external terminals connected to the common electrode patterns,
   wherein the first and second external terminals are disposed alternately.

5. The stacked chip device of claim 1, wherein a width of one exposed end portion of the plurality of electrode patterns is narrower than that of another end portion.

6. The stacked chip device of claim 5, wherein at least one of the end portions of the plurality of electrode patterns is deviated from a central line configured to divide the electrode patterns into two parts.

7. The stacked chip device of claim 1, wherein
   the common electrode patterns comprise non-conductor regions on at least parts of portions facing the vias.

8. A stacked chip device comprising:
   a first stack unit comprising a plurality of electrode patterns respectively disposed for a unit device region and common electrode patterns formed to be connected to cross the unit device regions;
   second and third stack units configured to be disposed on each of a top portion and a bottom portion of the first stack unit, each comprising a plurality of first and second conductor patterns; and
   a first via through which the first conductor pattern is vertically connected and a second via through which the second conductor pattern is vertically connected,
   wherein the first via comprises a first central via and a first end portion via being formed at a central portion and an end portion of the first conductor pattern, respectively,
   wherein the second via comprises a second central via and a second end portion via being formed at a central portion and an end portion of the second conductor pattern, respectively, and
   wherein the first end portion via and the second end portion via are disposed at different positions and are horizontally spaced apart from each other.

9. The stacked chip device of claim 8, wherein the common electrode patterns comprise a top common electrode pattern formed on a top portion of the electrode patterns and a bottom common electrode pattern formed on a bottom portion of the electrode patterns,
   the top common electrode pattern comprises a non-conductor region on a portion facing the first via configured to connect the first conductor pattern vertically, and
   the bottom common electrode pattern comprises a non-conductor region on a portion facing the second via configured to connect the second conductor pattern vertically.

10. The stacked chip device of claim 8, wherein the common electrode patterns comprise a top common electrode pattern formed on a top portion of the electrode patterns and a bottom common electrode pattern formed on a bottom portion of the electrode patterns, and
    the top common electrode pattern and the bottom common electrode pattern comprise non-conductor regions on a portion facing the first via configured to connect the first conductor patterns vertically and on a portion facing the second via configured to connect the second conductor patterns vertically.

11. The stacked chip device of claim 8, wherein the electrode patterns comprise non-conductor regions on at least parts of portions facing the first and second vias.

12. The stacked chip device of claim 8, wherein the common electrode patterns are formed on a sheet, and the non-conductor regions comprise regions in which parts of the common electrode patterns are removed and the sheet is exposed.

13. The stacked chip device of claim 8, wherein the non-conductor regions comprise insulation layers configured to cover parts of the common electrode patterns.

14. The stacked chip device of claim 8, wherein the non-conductor regions are formed with a size that is the same as or greater than that of the first and second vias.

* * * * *